United States Patent

Niwa

[11] Patent Number: 5,352,300
[45] Date of Patent: Oct. 4, 1994

[54] SOLAR CELL

[75] Inventor: Mitsuyuki Niwa, Nagahama, Japan

[73] Assignee: Canon Kabushiki Kaisha, Tokyo, Japan

[21] Appl. No.: 950,288

[22] Filed: Sep. 24, 1992

[30] Foreign Application Priority Data

Sep. 26, 1991 [JP] Japan ................... 3-247452

[51] Int. Cl.$^5$ ................... H01L 31/06; H01L 31/075; H01L 31/0376; H01L 31/0224
[52] U.S. Cl. .................... 136/256; 136/258; 257/458; 257/741; 257/749
[58] Field of Search ......... 136/256, 258 AM, 285 PC, 136/259; 257/436, 458, 741, 749

[56] References Cited

U.S. PATENT DOCUMENTS

| 4,064,521 | 12/1977 | Carlson | 257/54 |
| 4,226,897 | 10/1980 | Coleman | 437/165 |
| 5,078,803 | 1/1992 | Pier et al. | 136/256 |

FOREIGN PATENT DOCUMENTS

| 0204554 | 12/1986 | European Pat. Off. | |
| 55-108780 | 8/1980 | Japan | 136/251 |
| 55-125681 | 9/1980 | Japan | 437/4 |
| 56-69875 | 6/1981 | Japan | 136/258 AM |
| WO82/02284 | 7/1982 | PCT Int'l Appl. | |
| 2116775 | 9/1983 | United Kingdom | |

OTHER PUBLICATIONS

Inspec An 3474927 Trans. Korean Inst. Elect. Eng., vol. 38, No. 5, pp. 343-347, Choe et al., "Electrical and Optical Properties." Nov. 1993.

Patent Abstracts of Japan, vol. 4, No. 157 (E-32), Nov. 4, 1980 of JPA 55-108780.
Spear, et al., Solid State Communications, vol. 17, pp. 1193-1196 (1975).
Y. Hattori et al., Technical Digest of the International PVSEC-3, Tokyo, Japan 1987 A-IIa-3, pp. 171-174.
R. R. Arya et al., Technical Digest of the International PVSE-3, Tokyo, Japan 1987 A-IIIa-4, pp. 457-460.
W. Kusian et al., The Conference Record of the Nineteenth IEEE Photovoltaic Specialists Conference-1987, pp. 599-603.
M. Kondo et al., The Conference Record of the Nineteenth IEEE Photovoltaic Specialists Conference-1987, pp. 604-609.
C. X. Qiu, I. Shin, Solar Energy Materials, vol. 13, No. 2, 1986, pp. 75-84.
Igasaki & Shimaoka, Research Report of Shizuoka University, Electric Engineering Lab., vol. 21, No. 1, 1986, pp. 23-35.
Koinuma et al., Transactions of the Society of Japanese Ceramics, vol. 97, No. 10, 1989, pp. 1160-1163.

Primary Examiner—Arron Weisstuch
Attorney, Agent, or Firm—Fitzpatrick, Cella, Harper & Scinto

[57] ABSTRACT

A solar cell having a semiconductor layer has a structure in which a first electrode, a semiconductor layer, and a second electrode are stacked on a substrate, wherein a zinc oxide layer containing a transition metal is located between the semiconductor layer and at least one of the first and second electrodes and the density of the transition metal in the zinc oxide layer is continuously changed within a range of not less than 1 atm. ppm to not more than 5 atm %.

14 Claims, 9 Drawing Sheets

SOLAR CELL

BACKGROUND OF THE INVENTION

1. Field of the Invention

The present invention relates to a solar cell and, more particularly, to a solar cell in which its electrode structure is improved, output characteristics are stably improved, and reliability is also improved.

2. Related Background Art

In recent years, strong worldwide demand has arisen for increased power supply, and active power generation to answer this demand now poses a serious problem of environmental pollution caused by the power generation.

Under these circumstances, a power generation scheme of solar cells using sunlight has received a great deal of attention as a clean power generation scheme in which problems posed by terrestrial warming caused by radioactive contamination and emission of gases having a greenhouse effect can be solved, energy sources are less localized because sunlight is radiated on the entire area of the earth, and relatively high power generation efficiency can be obtained without requiring complicated bulky equipment. Thus, this power generation scheme is expected to cope with increased future power supply demand without destroying the environment, and various studies have been made for practical applications of the scheme.

In order to establish a power generation scheme which uses solar cells, and which can satisfy power supply needs, the solar cell must have sufficiently high efficiency of photoelectric conversion and stable characteristics and must allow mass-production as the basic requirements.

For this reason, the following solar cell and manufacturing method therefor have received a great deal of attention. That is, an easily accessible source gas such as silane is used and decomposed by a glow discharge or the like to deposit a semiconductor thin film such as non-monocrystalline silicon on a relatively inexpensive substrate such as a glass substrate or a metal sheet, thereby mass-producing solar cells. These solar cells can be manufactured with a small amount of energy at low cost as compared with a monocrystalline silicon solar cell or the like.

The study of applications of non-monocrystalline silicon to photovoltaic elements such as solar cells was started with the invention of a solar cell by D. E. Carlson (U.S. Pat. No. 4,064,521) based on the success of doping by W. E. Spear and P. G. LeComber (*Solid State Communications*, Vol. 17, pp. 1193–1196, 1975). Although the field of solar cells has a short history of research and development, a variety of fruitful studies have been reported.

Semiconductor layers as important constituent elements of a solar cell form semiconductor junctions such as the so-called p-n and p-i-n junctions. These semiconductor junctions can be formed by sequentially stacking semiconductor layers having different conductivity types, or incorporating a dopant having a conductivity type different from that of a given semiconductor layer into said semiconductor layer in accordance with ion implantation or the like, or by diffusion of a dopant by thermal diffusion. A solar cell obtained using a thin film semiconductor such as amorphous silicon as the non-monocrystalline silicon described above has been studied. In the manufacture of the solar cell according to known techniques, a source gas containing an element serving as a dopant such as phosphine ($PH_3$ for n-type semiconductor) or diborane ($B_2H_6$ for p-type semiconductor) is mixed with silane or the like serving as a main source gas, and the gas mixture is decomposed by a glow discharge or the like to obtain a semiconductor film having a desired conductivity type. Such semiconductor films are sequentially stacked on a desired substrate in a p-i-n or n-i-p structure, thereby easily obtaining a semiconductor junction.

As a result of these studies, solar cells using non-monocrystalline silicon have already been used in a variety of power generation applications, e.g., compact devices such as a wristwatch/clock, a compact calculator, and a streetlight. When non-monocrystalline silicon is to be applied to a large device for power generation, many problems left unsolved (e.g., lower conversion efficiency than that of a monocrystalline or compound semiconductor solar cell, and degradation) must be solved. These problems are posed as disadvantages of the monocrystalline silicon solar cells. Numerous attempts have been made to solve these problems.

For example, these attempts include use of p-type non-monocrystalline silicon carbide having a large forbidden band width as a incident-side window layer (Y. Uchida, US-Japan Joint Seminar, Technological Applications of Tetrahedral Amorphous Solids, Palo Alto, Calif. (1982)), use of p-type silicon carbide having fine crystal grains as a window layer (Y. Uchida et al., Technical Digest of the International PVSEC-3, Tokyo, Japan (1987) A-IIa-3, pp. 171–174), and the like.

In the use of non-monocrystalline silicon carbide having a large forbidden band width as a window layer, there is attempted a method of forming a so-called graded (i.e., the forbidden band width is continuously changed) buffer layer in which an energy band step formed at the p-i interface is eliminated to prevent the efficiency of photoelectric conversion from being degraded, in a short-wavelength range, the degradation being caused by redistribution or recombination of the carriers (R. R. Arya et al., Technical Digest of the International PVSEC-3, Tokyo, Japan (1987) A-IIIa-4, pp. 457–460).

According to another attempt, phosphorus atoms (P) or boron atoms (B) are doped in an i-type layer in a very small amount of 10 ppm or less to increase the carrier mobility in the i-type layer (W. Kuwano et al., The Conference Record of the Nineteenth IEEE Photovoltaic Specialists Conference-1987, p. 599; M. Kondo et al., The Conference Record of the Nineteenth IEEE Photovoltaic Specialists Conference-1987, p. 604).

According to still another attempt, p- and n-type dopants are diffused in a semiconductor layer having another conductivity type to weaken the semiconductor junctions at the p-n, p-i, and n-i interfaces, thereby preventing degradation in efficiency of photoelectric conversion of a photovoltaic element. An example of such an attempt is disclosed in Japanese Laid-Open Patent Application No. 55-125681 (applicant: Sanyo Electric Co., Ltd.). This prior art discloses a method of forming a solar cell by arranging a partition door in a plasma reaction chamber through which a glass substrate on a conveyor passes. U.S. Pat. No. 4,266,897 (Assignee: Plasma Physics Inc.) discloses a method in which spaces for forming respective semiconductor layers are separated from each other by gas gates (i.e., a mechanism in which a gas which does not contribute to film formation is forcibly strongly flowed to serve as partition walls for the film formation gases) in an apparatus for continuously forming a solar cell on an elongated substrate, thereby preventing a dopant from entering into the wrong film formation space.

Japanese Laid-Open Patent Application No. 56-69875 (applicant: Fuji Electric Col, Ltd.) discloses a method in which a transparent conductive layer is formed between a conductive substrate and a semiconductor layer in a solar cell having the semiconductor layer on the conductive substrate to increase the adhesion strength between the semiconductor layer and the substrate, or to improve the surface smoothness of the substrate, thereby improving the characteristics of the solar cell. Japanese Laid-Open Patent Application No. 55-108780 (applicant: Sharp Corporation) discloses a method in which a decrease in reflectance at an interface caused by formation of an alloy between the semiconductor atoms and a diffused metal element constituting the lower electrode located on the surface of a semiconductor layer at a side opposite to the light-receiving surface can be prevented by forming a transparent conductive layer such as a zinc oxide layer between the lower electrode and the semiconductor layer.

According to still another attempt, tin or indium is doped in a zinc oxide layer to decrease the resistivity of the zinc oxide layer (C. X. Qiu, I. Shin, *Solar Energy Materials*, Vol.. 13, No. 2, pp. 75–84, 1986). An example of aluminum doping in a zinc oxide layer is also reported (Igasaki & Shimaoka, Research Report of Shizuoka University, Electronic Engineering Lab., Vol. 21, No. 1, 1986), and an example of fluorine doping is also reported (Koinuma et al., *Transactions of the Society of Japanese Ceramics*, Vol. 97, No. 10, pp. 1160–1163, 1989).

As a result of efforts made by a number of engineers in addition to the above attempts, the disadvantages (e.g., low efficiency of photoelectric conversion and degradation) of non-monocrystalline silicon solar cells have been improved. However, the following problems are still left unsolved.

When a solar cell is formed by forming a semiconductor layer on a conductive substrate through a zinc oxide layer, the adhesion strengths between the zinc oxide layer and the conductive substrate and between the zinc oxide layer and the semiconductor layer are not sufficient. Slight peeling may occur due to temperature shocks and vibrations in formation of the semiconductor layer and the subsequent step. This peeling poses a problem of initial characteristics, i.e., degradation in efficiency of photoelectric conversion of the solar cell.

In addition, since the resistivity of the zinc oxide layer cannot be reduced to a negligible degree, an increase in series resistance of the solar cell can be expected, thus posing a problem of initial characteristics, i.e., degradation in efficiency of photoelectric conversion of the solar cell.

This also applies not only to formation of the semiconductor layer on the conductive substrate but also to a solar cell in which a transparent conductive layer is formed on a transparent insulating substrate and a semiconductor layer is formed on the transparent conductive layer. More specifically, slight peeling occurs between the transparent conductive layer and the semiconductor layer even during the manufacture due to insufficient adhesion strength between the transparent conductive layer and the semiconductor layer, thereby posing a problem of initial characteristics, i.e., degradation in efficiency of photoelectric conversion of the solar cell.

Even if slight peeling does not occur in the manufacture of a solar cell and efficiency of photoelectric conversion in the initial manufacturing period of the solar cell is rather high, slight peeling may occur between the conductive substrate and the transparent conductive layer and between the transparent conductive layer and the semiconductor layer in practical application states under various climatic and installation conditions, thereby degrading reliability due to gradual degradation in efficiency of photoelectric conversion of the solar cell.

SUMMARY AND OBJECTS OF THE INVENTION

The present invention has been made in consideration of the above, and has as an object to provide a solar cell having a structure in which a first electrode, a semiconductor layer, and a second electrode are sequentially stacked on a substrate, wherein adhesion strengths between the respective layers are increased without an increase in serial resistance, thereby improving the initial characteristics.

It is another object of the present invention to provide a solar cell in which adhesion strengths between the respective layers are increased to effectively prevent the characteristics from being degraded by slight film peeling occurring under practical application conditions, thereby improving the reliability.

In order to achieve the above objects of the present invention, there is provided a solar cell having a structure in which a first electrode, a semiconductor layer, and a second electrode are sequentially stacked on a substrate, wherein a zinc oxide layer containing a transition metal is formed between the semiconductor layer and at least one of the first and second electrodes, and the transition metal in the zinc oxide layer is distributed so that the density thereof continuously changes within a range of not less than 1 atm. ppm to not more than 5 atm %.

DETAILED DESCRIPTION OF THE PREFERRED EMBODIMENTS

Figure 1:
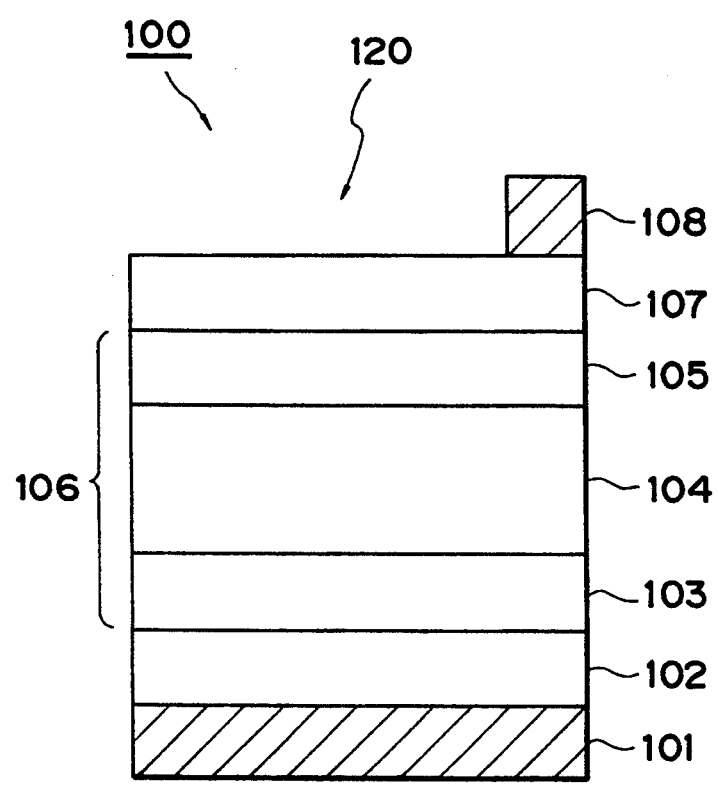
FIG. 1 is a view for explaining a solar cell according to an embodiment of the present invention.

FIG. 1 is a view illustrating a typical structure of a solar cell according to the present invention. In a solar cell 100 (FIG. 1) of the typical example of the present invention, a zinc oxide layer 102 containing a transition metal is formed on a conductive substrate 101, a pin type solar cell element 106 consisting of an n-type semiconductor layer 103, an i-type semiconductor layer 104, and a p-type semiconductor layer 105 is formed on the zinc oxide layer 102, and a transparent electrode 107 and a collector electrode 108 are sequentially formed on the pin type solar cell element 106. Light 120 is incident through the transparent electrode 107.

The solar cell according to the present invention is greatly different from the conventional solar cell in that a zinc oxide layer 102 containing a transition metal is formed.

Figure 2:
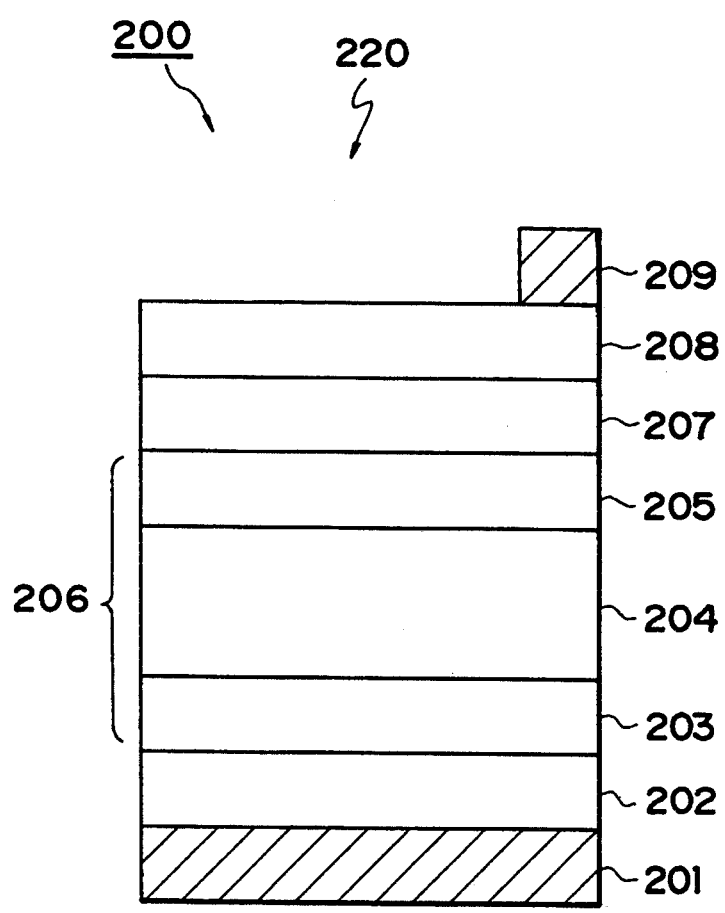
FIG. 2 is a view for explaining a solar cell according to another embodiment of the present invention.

FIG. 2 is a view illustrating another typical structure of a solar cell according to the present invention. In the solar cell 200 (FIG. 2) of this typical example, a zinc oxide layer 202 containing a transition metal is formed on a conductive substrate 201, a pin type solar cell element 206 consisting of an n-type semiconductor layer 203, an i-type semiconductor layer 204, and a p-type semiconductor 205 is formed on the zinc oxide layer 202, and a zinc oxide layer 207 containing a transition metal, a transparent electrode 208, and a collector electrode 209 are sequentially formed on the pin type solar cell element 206. Light 220 is incident through the transparent electrode 208.

Figure 3:
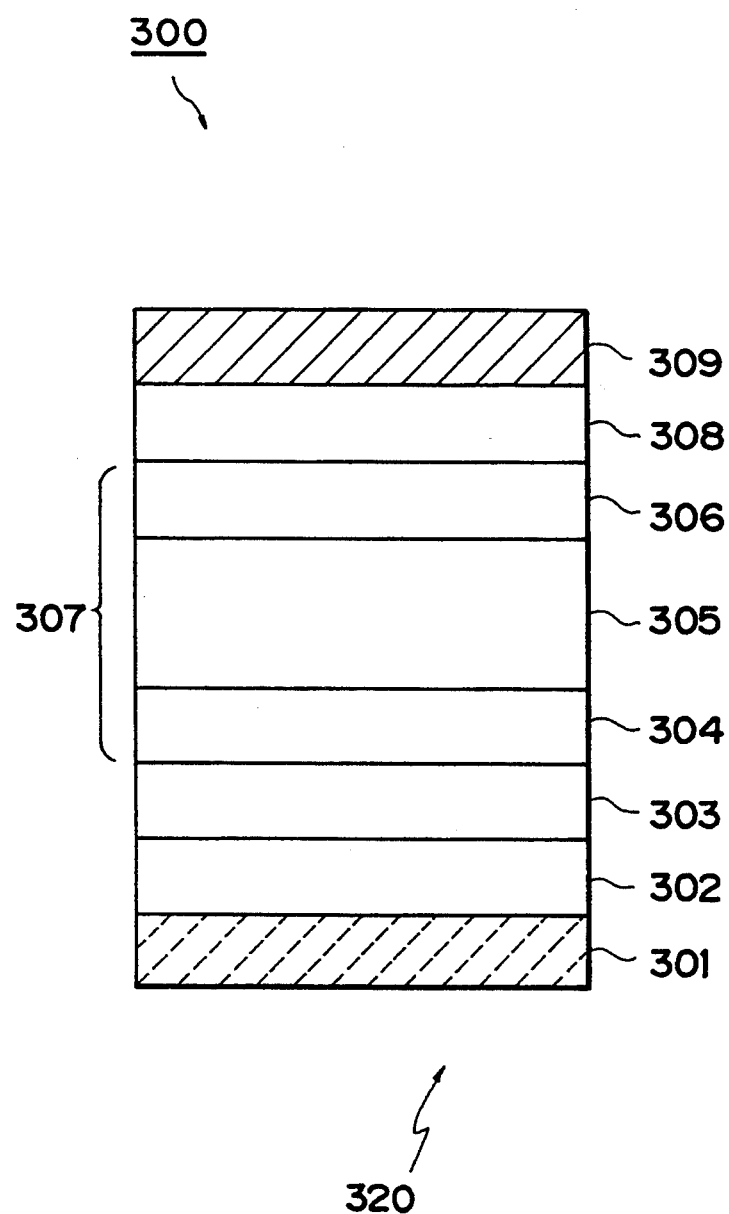
FIG. 3 is a view for explaining a solar cell according to still another embodiment of the present invention.

FIG. 3 is a view illustrating still another typical example of a solar cell according to the present invention. In the solar cell 300 (FIG. 3) of this typical example, a transparent electrode 302 is formed on a transparent substrate 301, and a zinc oxide layer 303 containing a transition metal is formed on the transparent electrode 302. A pin type solar cell element 307 consisting of a p-type semiconductor layer 304, an i-type semiconductor layer 305, and an n-type semiconductor layer 306 is formed on the zinc oxide layer 303. A zinc oxide layer 308 containing a transition metal, and a lower or rear electrode 309 are sequentially formed on the pin type solar cell element 307. Light 320 is incident on the transparent substrate 301.

Figure 4:
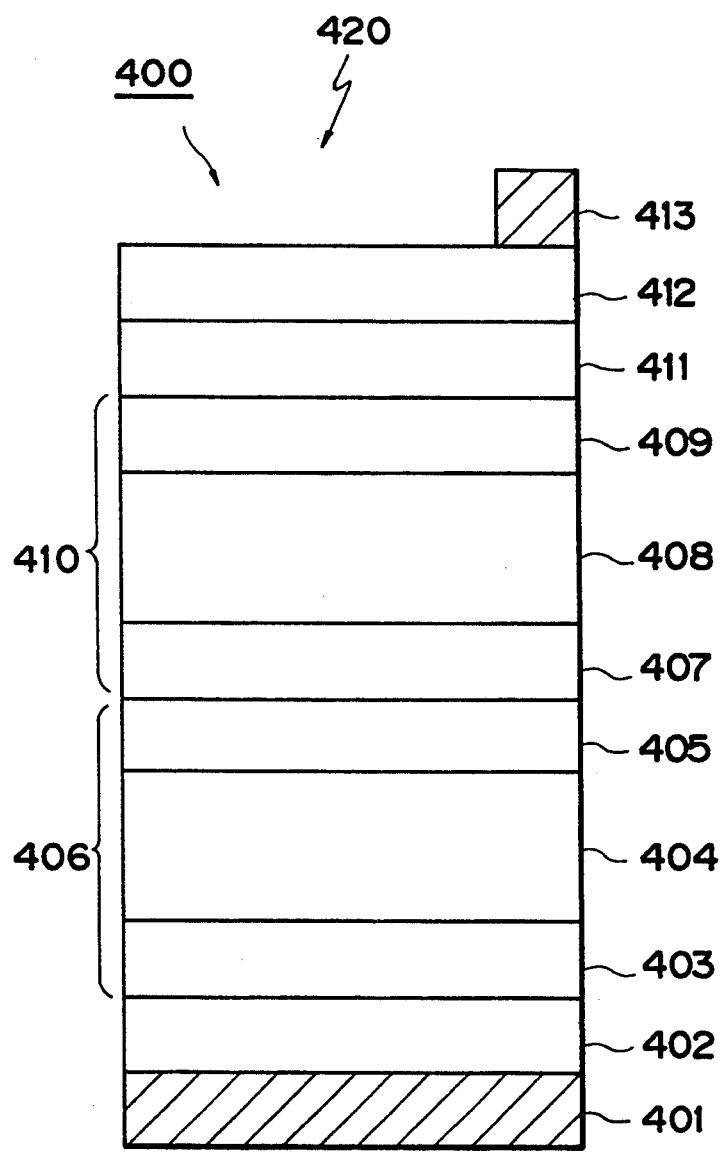
FIG. 4 is a view for explaining a solar cell according to still another embodiment of the present invention.

FIG. 4 is a view illustrating still another typical example of a solar cell according to the present invention. The solar cell 400 of this typical example is a so-called tandem cell in which pin type solar cell elements including two different semiconductor layers having different band gaps or film thicknesses as i-type layers are stacked to obtain a two-element structure. In the solar cell 400 shown in FIG. 4, a zinc oxide layer 402 containing a transition metal is formed on a conductive substrate 401. A first pin type solar cell element 406 consisting of a first n-type semiconductor layer 403, a first i-type semiconductor 404, and a first p-type semiconductor layer 405 is formed on the zinc oxide layer 402. A second pin type solar cell element 410 consisting of a first second n-type semiconductor layer 407, a second i-type semiconductor layer 408, and a second p-type semiconductor layer 409 is formed on the first pin type solar cell element 406. A zinc oxide layer 411 containing a transition metal, a transparent electrode 412, and a collector electrode 413 are sequentially formed on the second p-type semiconductor layer 409. Light 420 is incident through the transparent electrode 412.

In any solar cell example described above, the stacking order of the n- and p-type semiconductor layers can be reversed in accordance with an application purpose. However, the p-type semiconductor layer is preferably formed closer to the light-incident side because the generated carriers can then be effectively utilized.

The constituent elements of these solar cells will be described below.

Substrate

Applicable materials for the conductive substrate 101 can be exemplified by a plate or film consisting of a material selected from molybdenum, tungsten, titanium, cobalt, chromium, iron, copper, tantalum, niobium, zirconium, metal aluminum, and alloys thereof. In addition, stainless steel, a nickel-chromium alloy, nickel, tantalum, niobium, zirconium, metal titanium, and/or alloys thereof can be preferably used in view of corrosion resistance. A film or sheet of synthetic resin (e.g., polyester, polyethylene, polycarbonate, cellulose acetate, polypropylene, polyvinyl chloride, polyvinylidene chloride, polystyrene, or polyamide), glass, or ceramic on which one of the above metals and/or alloys thereof is formed can be used.

The conductive substrate 101 can be used singly, but a layer (referred to as a reflective conductive layer) having reflection properties with respect to visible light and electrical conductivity is preferably formed on the conductive substrate 101 to utilize light having passed through the semiconductor layer without being absorbed or to reduce the series resistance of the solar cell. Examples of applicable materials for the reflective conductive layer are silver, silicon, aluminum, iron, copper, nickel, chromium, molybdenum, and alloys thereof. Of these materials, silver, copper, aluminum, and an aluminum-silicon alloy are preferable. In addition, the reflective conductive layer may have a large thickness, and this thick reflective conductive layer may serve as the substrate itself.

Examples of the method of preferably forming a reflective conductive layer on the surface of the conductive substrate 101 are resistance heating deposition, electron beam deposition, and sputtering.

Applicable materials for the transparent substrate 301 are a film or sheet consisting of a material selected from polyester, polyethylene, polycarbonate, cellulose acetate, polypropylene, polyvinyl chloride, polyvinylidene chloride, polystyrene, and polyamide; a glass; or the like.

Electrode

Appropriate electrodes are selected in accordance with the structural forms of the solar cells according to the present invention. Electrodes of these solar cells are a lower electrode, an upper electrode (transparent electrode), and a collector electrode (note that the upper electrode is defined as an electrode on the light-incident side, and the lower electrode is an electrode arranged to oppose the upper electrode so as to sandwich a semiconductor electrode therewith).

The position of the lower electrode used in the solar cell according to the present invention varies depending on differences in the light incident surface in accordance with whether the substrate material is transparent or not.

More specifically, in the multilayered structures shown in FIGS. 1, 2, and 4, the conductive substrates 101, 201, and 401 also serve as the lower electrodes. In the multilayered structure shown in FIG. 3, since the transparent substrate 301 is used and light is incident from the transparent substrate 301, the rear or lower electrode 309 is formed to oppose the transparent substrate 301 so as to sandwich the semiconductor layer and the zinc oxide layer containing a transition metal therebetween, thereby extracting a current and effectively reflecting light which is not absorbed by the semiconductor layer and reaches the electrode.

Preferable examples of the material for the lower electrode of the solar cell of the present invention are metal (e.g., silver, gold, platinum, nickel, chromium, copper, aluminum, titanium, zinc, molybdenum, and tungsten) and alloys thereof. A layer made of one of the metals or an alloy thereof is formed in accordance with vacuum deposition, electron beam deposition, or sputtering. This metal thin film should not be a resistive component against the output from the solar cell, and preferably has a sheet resistance of 50 $\Omega/\square$ or less, and more preferably 10 $\Omega/\square$ or less.

The transparent electrodes 107, 208, 302, and 412 used in the present invention preferably have a transmittance of 70% or more, and more preferably 80% or more to effectively absorb light from the sun, a fluorescent lamp, or the like. Each transparent electrode preferably has a sheet resistance of 300 $\Omega/\square$ or less so as not to serve as an electrical resistance component against the output from the solar cell. Examples of materials having the above requirements include a semi-transparent metal thin film made of a metal oxide (e.g., $SnO_2$, $In_2O_3$, ZnO, CdO, $Cd_2SnO_4$, or ITO ($In_2O_3 + SnO_2$)) and a metal (e.g., Au, Al, or Cu). Each transparent electrode can be formed by resistive thermal deposition, electron beam thermal deposition, ion plating, sputtering, or spraying, selected in accordance with the desired characteristics of the solar cell.

The collector electrodes 108, 209, and 413 used in the present invention are formed on the corresponding transparent electrodes to reduce the sheet resistances of the transparent electrodes 107, 208, and 412. In the solar cells having the structures shown in FIGS. 1, 2, and 4, since the transparent electrodes are formed after the corresponding semiconductor layers are formed, the substrate temperature at the time of formation of the transparent electrodes cannot be set relatively high. For this reason, since the sheet resistances of the transparent electrodes inevitably become high, the collector electrodes 108, 209, and 413 are preferably formed. On the other hand, in the solar cell having the structure shown in FIG. 3, since the transparent electrode 302 is directly formed on the substrate, the substrate temperature can be set high, and the sheet resistance of the transparent electrode 302 can be set relatively low. Therefore, the collector electrode may be omitted.

Examples of the material for the collector electrode preferably used in the solar cell are metals (e.g., silver, gold, platinum, nickel, chromium, copper, aluminum, titanium, zinc, molybdenum, and tungsten), alloys thereof, and carbon. A layer consisting of each of these metals, an alloy thereof, or carbon is formed in accordance with vacuum deposition, electron beam deposition, sputtering, or printing. When layers of these metals, alloys thereof, or carbon are stacked, advantages (e.g., low resistance, less diffusion into a semiconductor layer, rigidity, and facilitation of electrode formation by printing or the like) of the metals, alloys, or carbon can be combined.

In order to assure a sufficient amount of light incident on a semiconductor layer, the shape and area of each collector electrode are properly designed. The shape of the collector electrode is preferably determined to uniformly spread on the light-receiving surface of the solar cell, and the area of the collector electrode is preferably 15% or less and more preferably 10% or less of the light-receiving surface.

The sheet resistance of the collector electrode is preferably 50 $\Omega/\square$ or less, and more preferably 10 $\Omega/\square$ or less.

Zinc Oxide Layer

Examples of the transition metal contained in each zinc oxide layer suitably used in the corresponding solar cell according to the present invention are iron, chromium, nickel, cobalt, manganese, titanium, vanadium, molybdenum, tungsten, iridium, or the like. The zinc oxide layer as the gist of the present invention contains at least one of these transition metal elements wherein the density of the transition metal is continuously changed within the range of 1 atm. ppm (inclusive) to 5 atm % (inclusive).

Methods of forming each zinc oxide layer suitably used in the solar cell according to the present invention are exemplified by vacuum deposition, sputtering, ion cluster beam deposition, chemical vapor deposition, and heating after spraying of a metal salt solution.

A method of adding the transition metal in the zinc oxide layer so as to provide a desired density distribution is exemplified as follows. When a zinc material is to be heated and deposited in an oxygen atmosphere, the zinc material placed in a crucible or boat is heated and deposited while a transition metal material is charged in the crucible or boat to cause the zinc oxide to contain the transition metal at a desired density distribution. Alternatively, the transition metal may be mixed at a predetermined mixing ratio in the zinc material beforehand. In this case, by utilizing a change in composition of a vapor source during the progress of deposition due to a difference between the melting points of zinc and the transition metal, the transition metal in the zinc oxide layer may have a density distribution. A desired density distribution and a desired mixing ratio can be realized by controlling the amount of vapor source and its temperature.

When a zinc oxide layer is to be formed by sputtering, sputtering is performed using a baked powder of zinc oxide containing a transition metal element as a sputtering target while the discharge power and pressure are appropriately changed, thereby obtaining a desired density distribution. When zinc metal containing a transition metal element is used as a target and reacted with oxygen in the sputtering gas to form a zinc oxide layer, the above method is utilized.

In addition, a thin piece or wire consisting of a transition metal and having a size adjusted to obtain a desired density distribution may be placed or welded onto a target not containing a transition metal. In this case, the density distribution of the transition metal in the zinc oxide layer can be adjusted in accordance with the consumption of the thin piece or wire consisting of the transition metal.

Any method can be used as the method of forming the zinc oxide layer containing a transition metal, suitably used in each solar cell according to the present invention. The present invention is not limited to a specific method of forming the zinc oxide layer containing a transition metal.

A method of forming a zinc oxide layer containing a transition metal will be described in detail below by using DC planar magnetron sputtering, but this method does not limit the scope of the present invention.

Figure 5:
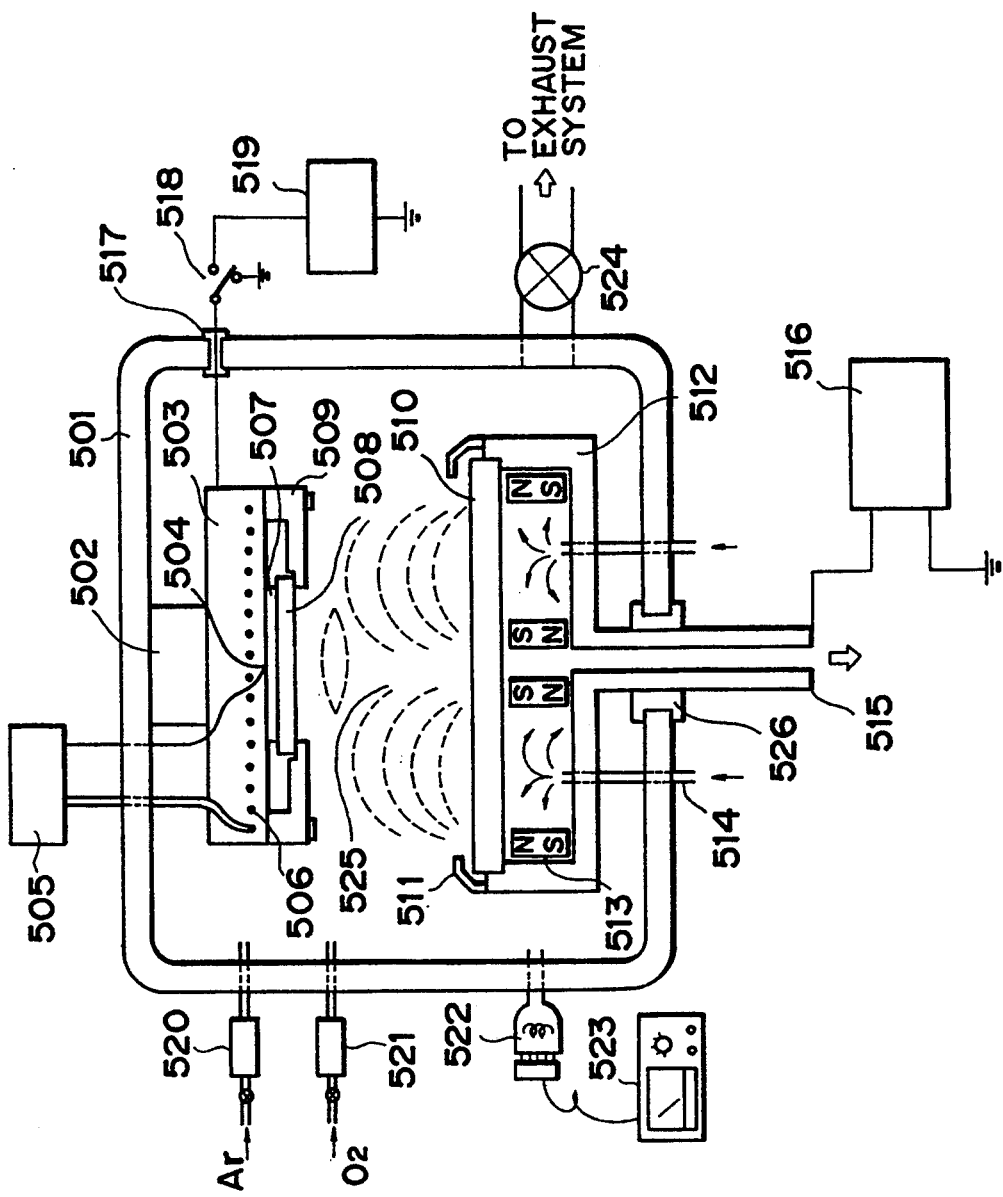
FIG. 5 is a view illustrating the arrangement of a DC planar magnetron sputtering apparatus as a means for realizing the present invention.

FIG. 5 is a view illustrating the arrangement of a DC planar magnetron sputtering apparatus. DC planar magnetron sputtering has an advantage in that high-speed sputtering can be performed by a compact apparatus. This method can be realized by an RF or RF magnetron apparatus.

Referring to FIG. 5, the DC planar magnetron sputtering apparatus includes a vacuum chamber 501 in which a heating plate 503 is supported on an insulating support pedestal 502. A switch 518 selectively applies a bias voltage from a bias power source 519 to a substrate 508. An insulating member 517 insulates the bias voltage line from the vacuum chamber 501. A heater 506 and a thermocouple 504 are embedded in the heating plate 503 and are controlled to a predetermined temperature by a temperature controller 505. The temperature of the substrate 508 upon sputtering is determined by the characteristics of the desired zinc oxide layer. If a semiconductor layer has already been formed on the substrate 508, the temperature of the substrate 508 is changed in accordance with the semiconductor layer formation conditions such as the formation temperature. When a substrate having a semiconductor layer thereon is heated to a temperature at which the semiconductor layer is formed, it is generally found that hydrogen is eliminated from the semiconductor material constituting the semiconductor layer, or impurity atoms are redistributed to degrade the characteristics of the semiconductor material and semiconductor junction. The crystal grain boundary may be emphasized by heating, depending on the types of metals constituting the substrate and reflective, conductive layer. Care must therefore be taken upon setting the substrate temperature. Assuming that the above conditions are taken into consideration, the substrate temperature falls within the range of room temperature to 500° C. The substrate 508 is supported by a substrate holder 509.

A target 510 is arranged opposite to the substrate 508. The target 510 is placed on a target support table 512 located on a discharge pipe 515 supported through an insulating material 526, and magnets 513 are located below the target 510 to form a magnetic field in a plasma space 525. Cooling water from cooling water supply pipes 514 for cooling the target heated during sputtering is supplied to the lower surface of the target. The supplied water cools the target and is discharged through the cooling water discharge pipe 515 passing through chamber wall 501 by means of insulative space 526.

The target 510 may consist of a baked powder of zinc oxide containing a transition metal, or zinc oxide with an added transition metal.

A DC voltage is applied from a sputtering power source 516 to the target 510 through the target table 512. The DC current supplied from the sputtering power source is set to be preferably 0.01 A or more, and more preferably 0.1 A or more. According to an experiment of the present inventor, at a large sputtering current, the light absorption of the formed zinc oxide film is low, and the efficiency of photoelectric conversion of a solar cell is high (the generated current is especially large). This also applies to formation of a zinc oxide layer by an RF sputtering method. A solar cell manufactured with a high RF power had an advantage in current generation over a solar cell manufactured with a low RF power.

Each of argon gas and oxygen gas as a sputtering gas is supplied through a mass flow controller 520 or 521. Other gases such as $SiF_4$ gas may be added to the sputtering gas to dope fluorine in the resultant zinc oxide gas. The flow rate of argon gas is preferably 1 sccm to 1 slm, and the flow rate of oxygen gas is preferably 0.1 sccm to 100 sccm.

The internal pressure can be monitored by a vacuum meter 523 (having a pressure gauge 522) mounted on the vacuum chamber 501. The entire interior of the vacuum chamber 501 is evacuated by a main valve 524 connected to an exhaust system (not shown). The internal pressure of the background prior to sputtering is preferably $10^{-4}$ Torr or less, and more preferably $10^{-5}$ Torr or less. The internal pressure during sputtering is set to be 1 mTorr (inclusive) to 1 Torr (inclusive).

Under the above conditions, formation of a zinc oxide layer is started. When the thickness of the zinc oxide layer reaches a desired value, power supply from the sputtering power source is interrupted, and the substrate is cooled. The interior of the vacuum chamber is set at atmospheric pressure, and the substrate on which the zinc oxide layer is formed is unloaded. If possible, the substrate is preferably annealed in a vacuum upon formation of the zinc oxide layer in order to increase the transmittance and conductivity of the zinc oxide layer.

Semiconductor Layer

Examples of the semiconductor material constituting an i-type semiconductor layer suitably used in each solar cell according to the present invention are Group IV and IV alloy semiconductor materials such as a non-monocrystalline material (to be referred to as "a-" hereinafter) a-Si:H, a-Si:F, a-Si:H-F, a-SiC:H, a-SiC:F, a-SiC:H:F, a-SiGe:H, a-SiGe:F, a-SiGe:H:F, poly-Si:H, poly-Si:F, poly-Si:H:F, or the like.

The hydrogen atom content of the i-type semiconductor layer is preferably 20 atm % or less, and more preferably 10 atm % or less.

A semiconductor material constituting a p- or n-type semiconductor layer suitably used in a solar cell according to the present invention can be obtained by doping a valence control agent in the semiconductor material constituting the i-type semiconductor layer. The semiconductor material constituting the p- or n-type semiconductor layer preferably contains a crystalline phase because then the light utilization efficiency can be improved and the carrier density can be increased. In this case, the crystal grains have a size of preferably 30 Å or more.

The density of hydrogen contained in the p- or n-type semiconductor layer is preferably 5 atm % or less, and more preferably 1 atm % or less.

Semiconductor layer formation source gases used in forming these semiconductor layers are gases of elements constituting the respective semiconductor layers, hydroxides thereof, halides thereof, organic metal compounds, and the like. Any material which can be supplied to the film formation space in a gaseous phase can be preferably used.

These sources gases can be used singly or as a mixture of two or more source gases. These source gases may be diluted with a dilution gas such as He, Ne, Ar, Kr, Xe, Rn or the like and the diluted source gas may be supplied to the film formation space.

The methods for forming each semiconductor layer used in a solar cell according to the present invention are exemplified by microwave plasma CVD, RF plasma CVD, sputtering, reactive sputtering, ion plating, photo-CVD, thermal-CVD, MOCVD, MBE, HR-CVD or the like, which can be used in a so-called semiconductor deposition film forming means. Appropriate means can be selected for the desired semiconductor layer to be formed.

A method of forming a semiconductor layer suitably used in a solar cell according to the present invention will be described with reference to the accompanying drawings. Microwave (2.45 GHz, to be referred to as "$\mu$W" hereinafter) plasma CVD and RF plasma CVD will be exemplified. However, the present invention is not limited thereto.

$\mu$W Plasma CVD

Figure 6:
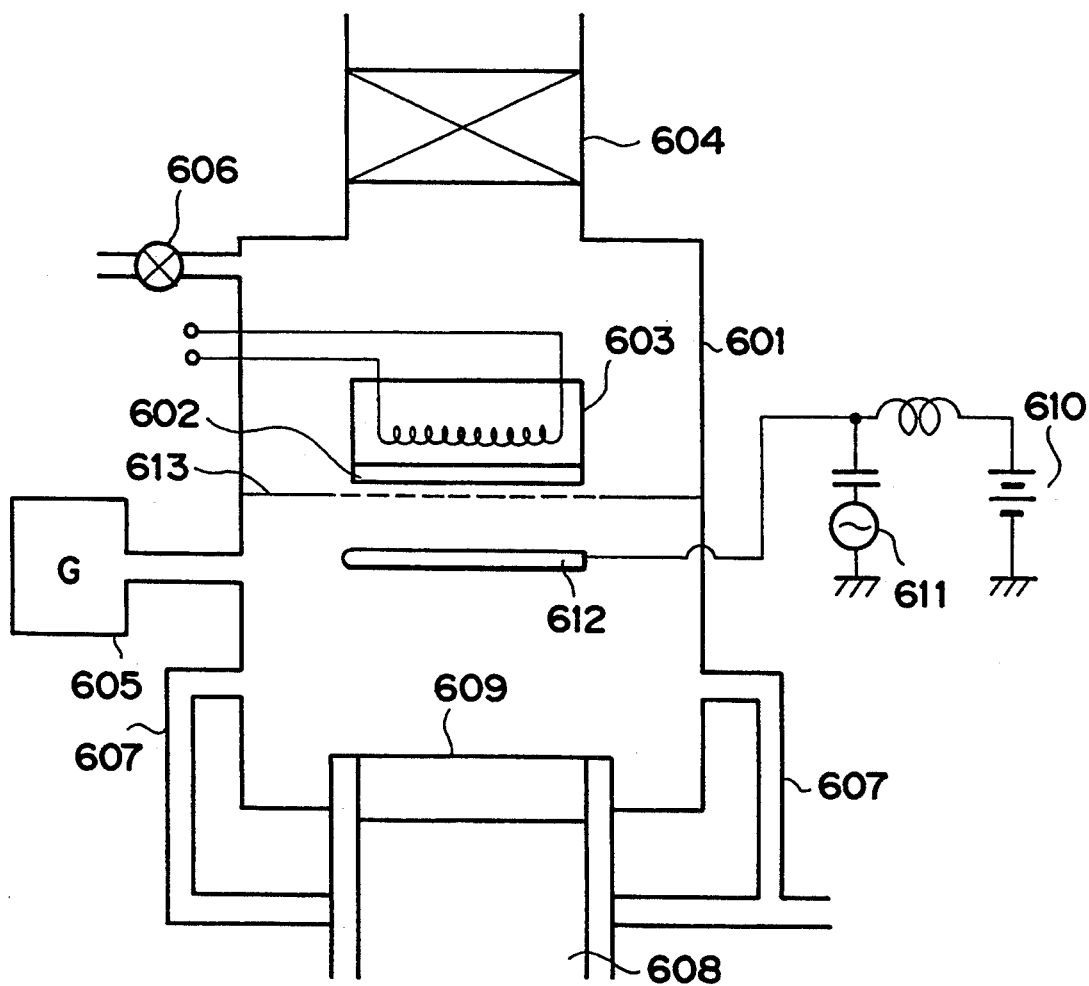
FIG. 6 is a diagram illustrating the arrangement of a $\mu$W plasma CVD apparatus as another means for realizing the present invention.

FIG. 6 is a view illustrating the arrangement of a $\mu$W plasma CVD apparatus.

Referring to FIG. 6, a substrate 602 stored in a vacuum chamber 601 is mounted on a substrate heater 603 and is kept heated at a temperature of 150° C. or more and more preferably 200° C. or more during formation of the semiconductor layer. A vacuum pump (not shown) is connected to the vacuum chamber 601 through a conductance valve 604. An operator adjusts the degree of opening of the conductance value 604 while checking a vacuum gauge 605 during supply of a semiconductor layer formation source gas, thereby setting the internal pressure of the vacuum chamber 601 to a desired pressure, i.e., 50 mTorr or less, and more preferably 20 mTorr or less. A leak valve 606 for atmospheric leakage is arranged in the vacuum chamber 601. SiH$_4$ gas as a preferable semiconductor layer formation source gas at a flow rate of 5 sccm to 500 sccm and H$_2$ gas at a flow rate of 0 sccm to 1 slm are supplied from a gas supply unit (not shown) to the vacuum chamber 601 through gas supply pipes 607. Hydrogen-diluted B$_2$H$_6$ gas (to be referred to as "B$_2$H$_6$/H$_2$gas" hereinafter) and hydrogen-diluted PH$_3$ gas (to be referred to as "PH$_3$/H$_2$ gas" hereinafter) are selectively supplied from a gas supply unit (not shown) to the vacuum chamber 601 through the gas supply pipes 607. The ratio of the total flow rate of B$_2$H$_6$ gas and the PH$_3$ gas to SiH$_4$ gas is determined in accordance with desired characteristics of a solar cell and semiconductor layer formation parameters and is preferably set within the range of 0.5% to 50%.

The $\mu$W power supplied from a $\mu$W power source (not shown) is supplied to the vacuum chamber 601 through a $\mu$W waveguide portion 608 and a dielectric window 609 to generate a plasma. The semiconductor layer formation source gas supplied to the vacuum chamber 601 is decomposed and excited by the plasma to form a semiconductor layer on the substrate 602. The $\mu$W power can be preferably set to 100 W or more, and more preferably 150 W or more. It is also possible to supply a sum of a DC bias of 0 V to 120 V from a DC power source 610 and RF power (frequency: 13.56 MHz) of 0 W to 200 W to a bias application electrode 612. In addition, a mesh or mesh-like grid 613 detachable upon its rotation and made of a conductive metal is arranged between the substrate 602 and the bias application electrode 612. It is also possible to control formation of a semiconductor layer by arranging an arbitrarily movable shutter (not shown) in front of the substrate.

RF Plasma CVD

Figure 7:
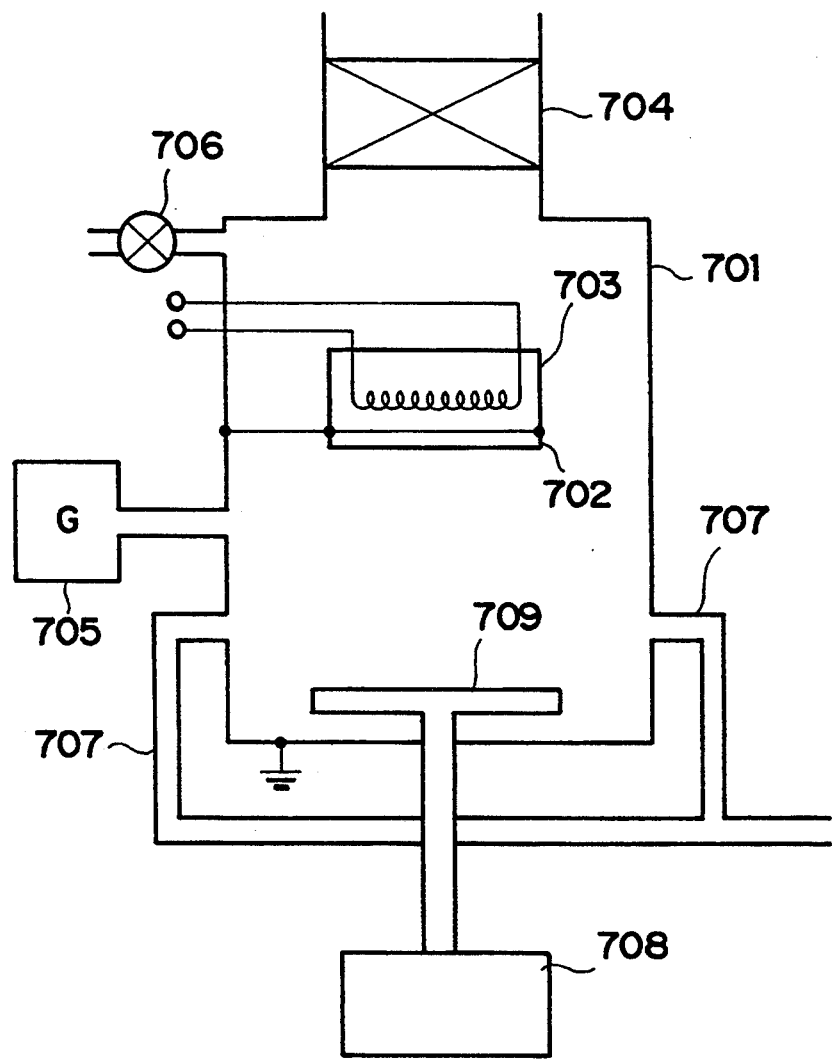
FIG. 7 is a diagram illustrating the arrangement of an RF plasma CVD apparatus as still another means for realizing the present invention.

FIG. 7 is a view illustrating the arrangement of an RF plasma CVD apparatus.

Referring to FIG. 7, a substrate 702 stored in a vacuum chamber 701 is mounted on a substrate heater 703 and is kept heated at a temperature of 100° C. or more and more preferably 150° C. or more during formation of the semiconductor layer. A vacuum pump (not shown) is connected to the vacuum chamber 701 through a conductance valve 704. An operator adjusts the degree of an opening of the conductance valve 704 while checking a vacuum gauge 705 during supply of a semiconductor layer formation source gas, thereby setting the internal pressure of the vacuum chamber 701 to a desired pressure, i.e., 5 mTorr or less, and more preferably 2 mTorr or less. A leak valve 706 for atmospheric leakage is arranged in the vacuum chamber 701. SiH$_4$ gas as a preferable semiconductor layer formation source gas at a flow rate of 0.5 sccm to 100 sccm and H$_2$ gas at a flow rate of 5 sccm to 500 sccm are supplied from a gas supply unit (not shown) to the vacuum chamber 701 through gas supply pipes 707. B$_2$H$_6$/H$_2$ gas and PH$_3$/H$_2$ are selectively supplied from a gas supply unit (not shown) to the vacuum chamber 701 through the gas supply pipes 707. The ratio of the total flow rate of B$_2$H$_6$ gas and the PH$_3$ gas to SiH$_4$ gas is determined in accordance with the desired characteristics of the solar cell and semiconductor layer formation parameters and is preferably set within the range of 0.5% to 50%.

The RF power supplied from an RF power source or RF matching box 708 is supplied to the vacuum chamber 701 to generate an RF plasma between the grounded substrate heater 703 and substrate 702 and a flat plate electrode or cathode 709 parallel to the heater 703 and the substrate 702. The semiconductor layer formation source gas supplied to the vacuum chamber 701 is decomposed and excited by the RF plasma to form a semiconductor layer on the substrate 702. The RF power is preferably set to be 1 mW/cm$^3$ or more, and more preferably 3 mW/cm$^3$ or more.

The present invention will be described in more detail by way of examples, but is not limited by these examples.

Example 1

An a-Si:H solar cell having the structure shown in FIG. 1 was manufactured as described below.

In Example 1, a conductive substrate 508 (=101) was prepared such that silver was deposited on a 0.1 mm thick 10 cm×10 cm stainless (SUS 304) plate having a surface treated with mirror polishing to form a reflective conductive layer having a thickness of 0.3 $\mu$m by a known vacuum deposition method.

A zinc oxide layer 102 containing a transition metal whose density was continuously changed was formed using the planar DC magnetron sputtering apparatus shown in FIG. 5.

After the substrate 508 deposited with silver was mounted on a heating plate 503, the interior of the vacuum chamber 501 was evacuated by means of a vacuum pump (not shown). After the degree of vacuum in the vacuum chamber 501 was confirmed with a vacuum meter 523 to be 10$^{-5}$ Torr or less, heater 506 was turned on to heat the heating plate 503 at 400° C. under the control of a temperature controller 505.

In Example 1, target 510 was a baked powder of zinc oxide containing 3 atm % of iron atoms. Argon gas as a sputtering gas was supplied while its flow rate was controlled to 24 sccm by a mass flow controller 520. After the flow rate of argon gas was stabilized, a DC voltage from the sputtering power source 516 was applied to the target 510 through a target table 512 so that the sputtering current was set to 0.3 A. The internal pressure during sputtering the maintained at 7 mTorr by adjusting a conductance valve (not shown).

After formation of the zinc oxide layer was started as described above, the sputtering power source was adjusted to gradually increase the sputtering current with a continuous increase in DC voltage. When the thickness of the zinc oxide layer reached 1.0 $\mu$m, the sputtering current was 0.5 A. When the thickness of the zinc oxide layer reached 1.0 $\mu$m, power from the sputtering power source was interrupted, supply of the sputtering gas was also interrupted, and the heater 506 was switched off. After the substrate was cooled, the vacuum chamber 501 was set at the atmospheric pressure, and the substrate having the zinc oxide layer thereon was unloaded.

An n-type semiconductor layer 103, an i-type semiconductor layer 104, and a p-type semiconductor layer 105 each consisting of a-Si:H were formed on the zinc oxide layer by using the $\mu$W plasma CVD apparatus shown in FIG. 6.

As described above, a substrate 602 having the zinc oxide layer containing a transition metal was mounted on a substrate heater 603, and the interior of vacuum chamber 601 was evacuated by a vacuum pump (not shown). When the reading of the vacuum gauge 605 became about $1 \times 10^{-4}$ Torr, the substrate header 603 was turned on to heat the substrate heater 603 at 380° C.

A semiconductor layer formation source gas supply valve (not shown) was gradually opened to supply SiH$_4$ gas, H$_2$ gas, and PH$_3$ gas diluted with H$_2$ gas to 10% (referred to as "PH$_3$/H$_2$ gas" hereinafter) to the vacuum chamber 601 through gas supply pipes 607. At this time, mass flow controllers (not shown) controlled the flow rates of the SiH$_4$ gas, H$_2$ gas, and PH$_3$/H$_2$ gas to be 10 sccm, 100 sccm, and 1.0 sccm, respectively.

When the flow rates of the gases were stabilized, the degree of opening of conductance valve 604 was adjusted while the internal pressure of the vacuum chamber 601 was adjusted to 5 mTorr with the vacuum gauge 605. A DC bias of +100 V was applied from a DC power source 610 to a bias application electrode 612. Thereafter, the power of a $\mu$W power source (not shown) was set to 400 W, and the $\mu$W power was supplied to the vacuum chamber 601 through a waveguide (not shown), a $\mu$W waveguide portion 608, and a dielectric window 609 to cause a $\mu$W glow discharge, thereby starting formation of an n-type semiconductor layer 103 on the substrate 602.

When the thickness of the n-type semiconductor layer 103 became about 20 nm, supply of the $\mu$m power was interrupted, and the output of the DC power source 610 was disconnected. In addition, supply of the gases to the vacuum chamber 601 was interrupted to finish formation of the n-type semiconductor layer 103. The i-type semiconductor layer 104 was formed as follows. The substrate 602 was kept heated at 250° C. by the substrate heater 603, and SiH$_4$ gas was supplied to the vacuum chamber 601 through the gas supply pipes 607 at a flow rate of 150 sccm. The degree of opening of the conductance valve 604 as adjusted while the internal pressure of the vacuum chamber 601 was adjusted to be 5 mTorr with the vacuum gauge 605. A rotatable mesh or mesh-like grid 613 was rotated to remove it from the area near the substrate 602. A combined DC bias of +60 V from the DC power source 610 and an RF power (frequency: 13.56 MHz) of 100 W from an RF power source 611 was applied to the bias application electrode 612. Thereafter, the power of a $\mu$W power source (not shown) was set to be 300 W, and the $\mu$W power was supplied to the vacuum chamber 601 through a waveguide (not shown), the $\mu$W waveguide portion 608, and the dielectric window 609 to cause $\mu$W glow discharge, thereby starting formation of the i-type semiconductor layer on the n-type semiconductor layer.

When the thickness of the i-type semiconductor layer 104 became about 400 nm, supply of the $\mu$W power was stopped, and outputs of the DC power source 610 and the RF power source 611 were interrupted. Supply of the gas to the vacuum chamber 601 was then interrupted, thereby completing formation of the i-type semiconductor layer 104.

The p-type semiconductor layer 105 was formed as follows. The substrate 602 was kept heated at 200° C. by the substrate heater 603, and SiH$_4$, H$_2$ gas, and BF$_3$ gas diluted with H$_2$ to 10% (referred to as "BF$_3$/H$_2$ gas" hereinafter) were supplied to the vacuum chamber 601 through gas supply pipes 607. At this time, respective mass controllers controlled the flow rates of the SiH$_4$, H$_2$, and BF$_3$/H$_2$ gases to be 10 sccm, 100 sccm, and 1.0 sccm, respectively. The degree of opening of the conductance valve 604 was adjusted while the internal pressure of the vacuum chamber 601 was adjusted to be 5 mTorr with the vacuum gauge 605. A DC bias of +100 V was applied from the DC power source 610 to the bias application electrode 612. Thereafter, the power of a $\mu$W power source (not shown) was set to 400 W, and the $\mu$W power was supplied to the vacuum chamber 601 through a waveguide (not shown), the $\mu$W waveguide portion 608, and the dielectric window 609 to cause a $\mu$W glow discharge, thereby starting formation of the p-type semiconductor layer on the i-type semiconductor layer.

When the thickness of the p-type semiconductor layer 105 reached about 10 nm, supply of the $\mu$W power was interrupted, and the output of the DC power source 610 was disconnected. Supply of the gases to the vacuum chamber 601 was interrupted to complete formation of the p-type semiconductor layer 105.

The argon purge operation inside the vacuum chamber 601 and the gas supply pipes 607 was repeated three times, and the gas supply valve was closed. The leak valve 606 was opened to set the vacuum chamber 601 at atmospheric pressure. The substrate having the n-, i-, and p-type semiconductor layers thereon was unloaded from the vacuum chamber 601.

A 75-nm thick ITO (In$_2$O$_3$+SnO$_2$) layer as a transparent electrode 107 was vacuum-deposited on the p-type semiconductor layer 105 of the a-Si:H solar cell formed as described above in accordance with known resistance heating vacuum deposition. A 2 $\mu$m thick Al layer as a collector electrode 108 was deposited by known resistance heating vacuum deposition, thereby forming the a-Si:H solar cell.

In addition, under the same conditions as in the solar cell of Example 1, except that the density of the iron atoms in the zinc oxide serving as the target in the DC planar C magnetron sputtering method was variously changed to form different zinc oxide layers 102, a-Si:H solar cell samples were formed, and the dependencies of solar cell characteristics on the densities of iron atoms in zinc oxide layers 102 formed on the corresponding conductive substrates 101 were examined as follows.

Figure 8:
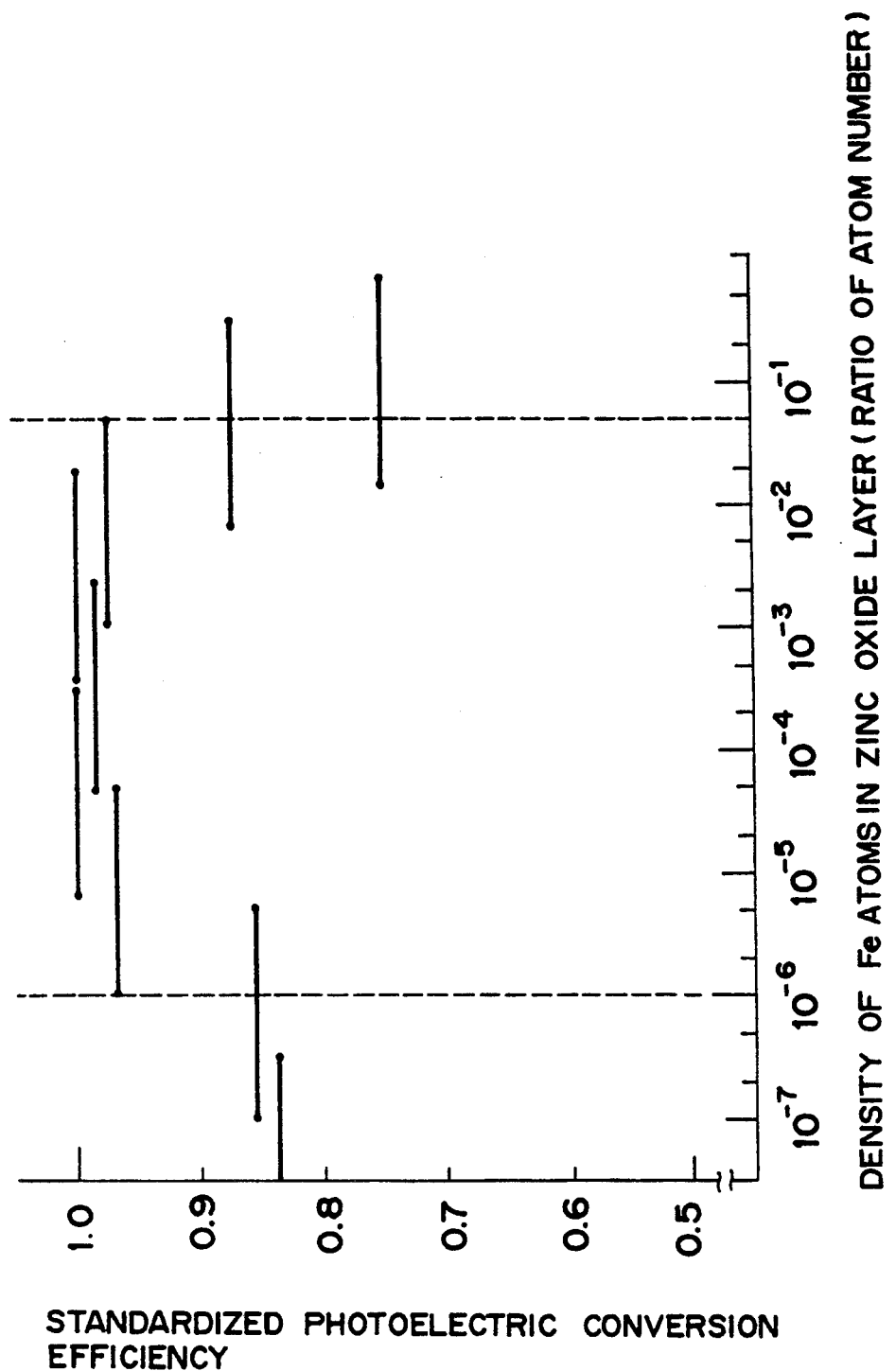
FIG. 8 is a graph showing the relationship between the density of iron atoms contained in a zinc oxide layer of a solar cell manufactured by Example 1 and the efficiency of photoelectric conversion thereof.

Using a solar simulator (YSS-150 available from Yamashita Denso), the current-voltage characteristics of these solar cell samples were measured under pseudo sunlight (AM-1.5, 100 mW/cm$^2$), the densities of iron atoms in the zinc oxide layers in the respective samples were measured with an SIMS, and the relationship between them was examined. Test results are summarized in FIG. 8. Each data point in FIG. 8 is normalized (standardized) when the maximum value is defined as 1.

The ratio of the density of iron atoms in the zinc oxide layer in the initial period of formation of the zinc oxide film to that immediately before the end of film formation in each solar cell sample was about 50. In FIG. 8, the length of each bar shows the extent of the density distribution of the iron atoms.

An a-Si:H solar cell sample was manufactured as a comparative example following the same procedures as in Example 1 except that the DC sputtering voltage, and hence the sputtering current, was not changed during formation of the zinc oxide layer by DC magnetron sputtering. The a-Si:H solar cell sample of the Comparative Example was subjected to the measurement of efficiency of photoelectric conversion, and the measurement values were compared with those of the solar cell characteristics of Example 1. The efficiency of photoelectric conversion of the sample of the Comparative Example was 0.94 when the efficiency of photoelectric conversion of the solar cell sample of Example 1 was defined as one.

Judging from the above test results, in the solar cell in which the iron atoms were contained in the zinc oxide layer and their density was continuously changed within the range of 1 atm. ppm (inclusive) to 5 atm % (inclusive), it was found that the efficiency of photoelectric conversion was greatly improved. The most improved part of the solar cell having the improved efficiency of photoelectric conversion was determined. The series resistance within the solar cell element was most improved. As a result, it was found that the fill factor, and hence the efficiency of photoelectric conversion, was improved. It is assumed that the resistivity of the zinc oxide layer was effectively reduced by doping the transition metal in the zinc oxide layer.

The following durability test of these solar cell samples was conducted to examine reliability under actual application conditions.

Figure 9:
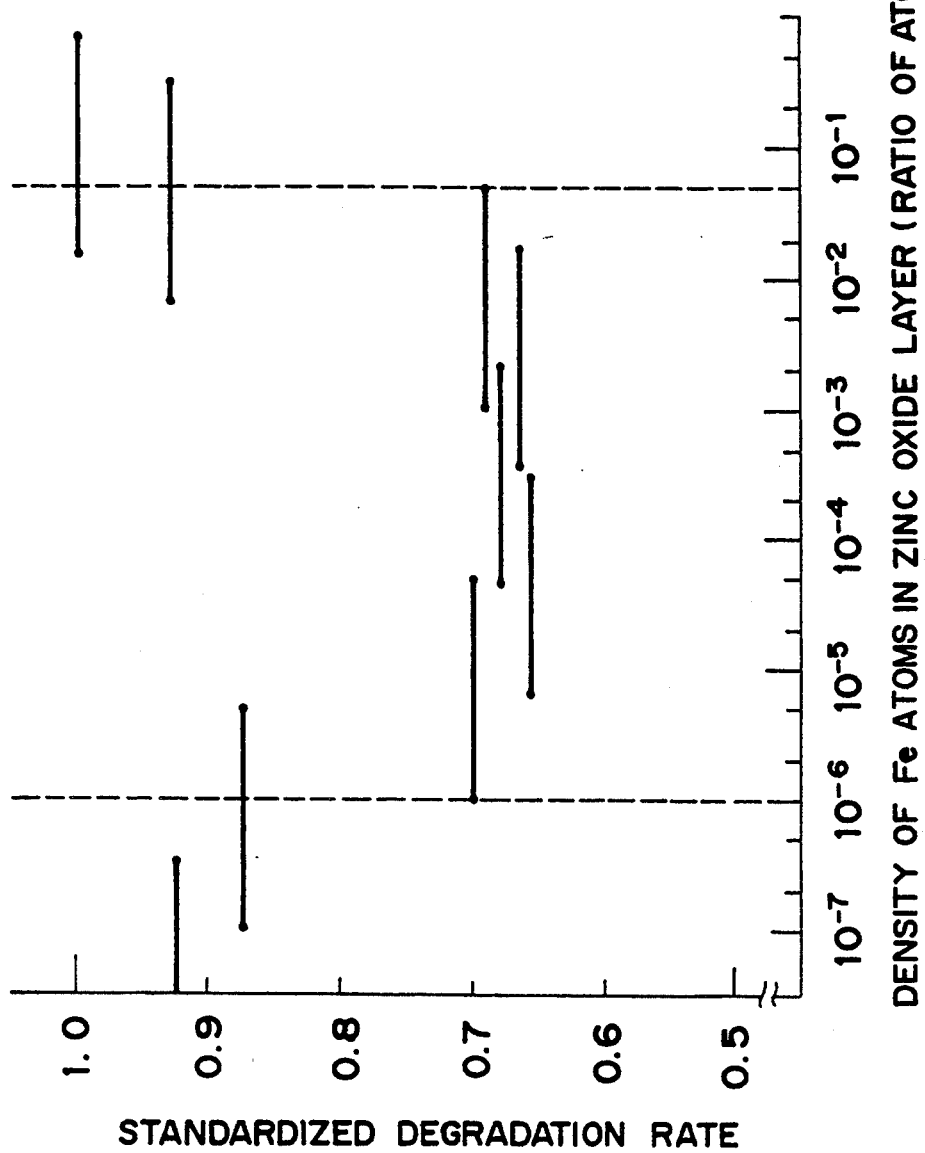
FIG. 9 is a graph showing the relationship between the density of iron atoms contained in a zinc oxide layer of a solar cell manufactured by Example 1 and the standardized rate of degradation thereof.

Each of the solar cell samples manufactured in Example 1 was hermetically sealed with a protective film consisting of polyvinylidene fluoride (PVF) and was placed under actual application conditions (i.e., outdoor installation while fixed resistors each having a resistance of 50 Ω were connected to both electrodes of each sample) for one year, and efficiency of photoelectric conversion was evaluated again. The rate of degradation (i.e., a value obtained by dividing the degraded efficiency value of photoelectric conversion by the initial efficiency value of photoelectric conversion) caused by light radiation, temperature differences, wind and rain or the like was measured. Results are shown in FIG. 9.

As a result, a solar cell sample in which a zinc oxide layer contains iron atoms and their density is continuously changed within the range of 1 atm. ppm (inclusive) to 5 atm % (inclusive) has greatly improved reliability, but the reason why this improvement can be made is not yet clarified. However, it is assumed that the structure in the zinc oxide layer is changed due to the density distribution of iron atoms in the zinc oxide layer to effectively relax stresses generated upon formation of different types of deposition films on both sides of the zinc oxide layer and external stresses, thereby minimizing film peeling which may occur during the manufacture or in actual application conditions in conventional solar cells. In FIG. 9, the length of each bar shows the extent of the density distribution of the iron atoms.

Example 2

As shown in FIG. 2, an a-Si:H solar cell having a structure in which zinc oxide layers 202 and 207 each containing a transition metal were formed between a conductive substrate 201 and an n-type semiconductor layer 203 and between the p-type semiconductor layer and a transparent electrode 208, respectively, was manufactured as follows.

A 1 mm thick 10 cm×10 cm aluminum plate having a surface treated with mirror polishing was used as a conductive substrate 201 in Example 2.

A zinc oxide layer 202 containing the transition metal was formed on the conductive substrate 201 following the same procedures as in Example 1. An n-type semiconductor layer 203, an i-type semiconductor layer 204, and a p-type semiconductor layer 205 were formed on the zinc oxide layer 202 by the RF plasma CVD apparatus shown in FIG. 7 in accordance with a method to be described below.

After a substrate 702 on which a zinc oxide layer containing a transition metal element was formed and mounted on the substrate heater 703, the interior of the vacuum chamber 701 was evacuated by means of a vacuum pump (not shown). When the reading of the vacuum gauge 705 reached about $1 \times 10^{-4}$ Torr, the substrate heater 703 was turned on to the heat the substrate heater 703 at 300° C.

A semiconductor layer formation source gas supply valve (not shown) was gradually opened to supply SiH$_4$ gas, H$_2$ gas, and PH$_3$/H$_2$ gas to the vacuum chamber 701 through the gas supply pipes 707. At this time, mass flow controllers (not shown) controlled the flow rates of SiH$_4$, H$_2$, and PH$_3$/H$_2$ gases to be 2 sccm, 50 sccm, and 1.0 sccm, respectively. The degree of opening of the conductance valve 704 was adjusted while the internal pressure of the vacuum chamber 701 was adjusted to 1 Torr with the vacuum gauge 705.

When the internal pressure of the vacuum chamber 701 was stabilized, the output power of an RF power source (not shown) was set at 200 mW/cm$^3$, and the RF power was supplied to a flat plate electrode or cathode 709 through a RF power supply or RF matching box 708 to cause an RF glow discharge, thereby starting formation of the n-type semiconductor layer 203 on the zinc oxide layer 202.

When the thickness of the n-type semiconductor layer reached 5 nm, the RF glow discharge was stopped, and supply of the gases to the vacuum chamber 701 was interrupted, thereby completing formation of the n-type semiconductor layer 203.

The i-type semiconductor layer 204 was formed on the n-type semiconductor layer 203 as follows. The substrate 702 was heated at 280° C. by the substrate heater 703, and SiH₄ and H₂ gas were supplied to the vacuum chamber 701 through the gas supply pipes 707 at flow rates of 2 sccm and 20 sccm, respectively. At this time, the degree of opening of the conductance valve 704 was adjusted while the internal pressure of the vacuum chamber 701 was set at 1 Torr with the aid of vacuum gauge 705. Thereafter, the power output of an RF power source (not shown) was set at 5 mW/cm³, and the RF power was supplied to the cathode 709 through the RF matching box 708 to cause an RF glow discharge, thereby starting formation of the i-type semiconductor layer 204 on the n-type semiconductor layer 203.

When the thickness of the i-type semiconductor layer 204 reached 400 nm, the glow discharge and supply of the gases were stopped, thereby completing formation of the i-type semiconductor layer 204.

The p-type semiconductor layer 205 was formed on the i-type semiconductor layer 204 as follows. The substrate 702 was heated at 250° C. by the substrate heater 703, and SiH₄ gas, H₂ gas, and B₂H₆/H₂ gas were supplied to the vacuum chamber 701 through the gas supply pipes 707. At this time, mass flow controllers controlled the flow rates of the SiH₄, H₂ and B₂H₆/H₂ gases at 2 sccm, 20 sccm, and 1.0 sccm, respectively. The degree of opening of the conductance valve 704 was adjusted while the internal pressure of the vacuum chamber 701 was set at 1 Torr with the vacuum gauge 705. Thereafter, the power output of an RF power source (not shown) was set at 10 mW/cm³, and the RF power was supplied to the cathode 709 through the RF matching box 708 to cause an RF glow discharge, thereby starting formation of the p-type semiconductor layer 205 on the i-type semiconductor layer 204.

When the thickness of the p-type semiconductor layer 205 reached 10 nm, the RF glow discharge and the supply of the gases were stopped, thereby completing formation of the p-type semiconductor layer 205.

Upon completion of formation of the p-type semiconductor layer 205, an argon purge operation inside the vacuum chamber 701 and the gas supply pipes 707 was repeated three times, and the gas supply valve was closed. Leak valve 706 was opened to set the vacuum chamber 701 at atmospheric pressure, and the substrate 702 having the n-, i-, and p-type semiconductor layers thereon was unloaded from the vacuum chamber 701.

A zinc oxide layer 207 containing a transition metal was formed on the p-type semiconductor layer 205 following the same procedures as in formation of the zinc oxide layer 202 except that the direction of change in DC sputtering voltage, and hence DC sputtering current, was reversed, i.e., from 0.5 A to 0.3 A, and the temperature of the heating plate 503 was set at 230° C.

Subsequently, a transparent electrode 208 and a collector electrode 209 were formed on the zinc oxide layer 207 following the same procedures as in Example 1, thereby manufacturing the a-Si:H solar cell. This a-Si:H solar cell was tested following the same procedures as in Example 1.

The two zinc oxide layers of the solar cell samples manufactured in Example 2 were almost identical in that the densities of iron atoms contained in zinc oxide layers of the solar cell samples were continuously changed from 60 atm. ppm to 0.3 atm %, except the directions of changes were opposite to each other.

Of all the solar cell samples manufactured in Example 1, the one having almost the same density of iron atoms in the zinc oxide layer as that of the sample of Example 2 was compared with the sample of Example 2. As a result, the efficiency of photoelectric conversion and the rate of degradation of the solar cell sample having the zinc oxide layers on both sides of the semiconductor layer, i.e., the solar cell sample manufactured in Example 2 were 0.98 and 0.94, respectively, when the efficiency of photoelectric conversion and the rate of degradation of the solar cell sample having the zinc oxide layer on only the substrate side of the semiconductor layer, i.e., the solar cell sample manufactured in Example 1 were defined as 1.

As a result, it is found that the solar cell sample having the zinc oxide layers containing the transition metal on both sides of the semiconductor layer, manufactured in Example 2, has higher reliability than the solar cell sample having the zinc oxide layer on one side, although the sample in Example 2 is somewhat inferior in initial efficiency to the sample in Example 1.

Example 3

An a-Si:H solar cell was manufactured following the same procedures as in Example 1 except that the transition metal contained in the zinc oxide layer was molybdenum.

The solar cell sample thus manufactured was subjected to measurement following the same procedures as in Example 1.

The density of molybdenum atoms contained in the zinc oxide layer of the solar cell sample manufactured in Example 3 was continuously changed from 300 atm. ppm to 0.5 atm %.

Of the solar cell samples manufactured in Example 1, the one having almost the same content of iron atoms in the zinc oxide layer as that of the sample of Example 3 was compared with the sample of Example 3. The efficiency of photoelectric conversion and the rate of degradation of the solar cell sample manufactured in Example 3, i.e., the solar cell having the zinc oxide layer containing molybdenum as the transition metal were 1.07 and 1.00, respectively, when the efficiency of photoelectric conversion and the rate of degradation of the solar cell sample manufactured in Example 1, i.e., the solar cell having the zinc oxide layer containing iron as the transition metal were defined as 1.

Example 4

As shown in FIG. 3, a transparent electrode 302, a zinc oxide layer 303 containing chromium as a transition metal, a p-type semiconductor layer 304, an i-type semiconductor layer 305, an n-type semiconductor layer 306, a zinc oxide layer 308 containing chromium as a transition metal, and a lower electrode 309 were sequentially formed on a glass substrate 301 to obtain an a-Si:H solar cell sample.

A Corning #7059 glass substrate having both surfaces polished was used as the glass substrate 301. The transparent electrode 302 and the lower electrode 309 made of tin oxide (SnO₂) films were formed by standard vacuum thermal deposition. The zinc oxide layers 303 and 308 containing the transition metal were formed following the same procedures as in Example 2 except that chromium was used as the transition metal. Each of the chromium densities of these two zinc oxide layers in the solar cell sample was continuously changed from 0.05 atm % to 3 atm %. The respective semiconductor layers were formed by RF plasma CVD.

An a-Si:H solar cell sample without the zinc oxide layers 303 and 308 containing the transition metal was manufactured as the Comparative Example with respect to the a-Si:H solar cell sample manufactured in Example 4.

The characteristics of these solar cell samples were measured following the same procedures as in Example 1. As a result, the solar cell sample of Example 4 had an efficiency of photoelectric conversion 1.13 times and a rate of degradation 0.80 times those of the solar cell sample of the Comparative Example.

As has been described above, in a solar cell having a structure in which a first electrode, a semiconductor layer, and a second electrode are stacked on a substrate, a zinc oxide layer containing a transition metal is formed between the semiconductor layer and at least one of the first and second electrodes, and the density of the transition metal in the zinc oxide layer is continuously changed within the range of 1 atm. ppm to 5 atm %, thereby obtaining the following effects.

When a solar cell is arranged such that a semiconductor layer is formed on a conductive substrate through a zinc oxide layer, the adhesion strengths between the zinc oxide layer and the conductive substrate and between the zinc oxide layer and the semiconductor layer are increased. Slight peeling which may occur due to temperature shocks and vibrations in formation of the semiconductor layer and the subsequent steps can be prevented. As a result, a solar cell having greatly improved efficiency of photoelectric conversion can be obtained.

In addition, there is also provided a solar cell having greatly improved efficiency of photoelectric conversion without increasing the series resistance since the resistivity of the zinc oxide layer can be reduced.

In addition, even in a solar cell having a semiconductor layer formed on a transparent conductive layer formed on a transparent insulating substrate, the adhesion strength between the transparent conductive layer and the semiconductor layer is increased, thereby providing a solar cell which has greatly improved efficiency of photoelectric conversion and is capable of preventing slight peeling which may occur between the transparent conductive layer and the semiconductor layer during the manufacture.

There is also provided a solar cell whose reliability can be greatly improved by effectively preventing slight peeling which may occur between the conductive substrate and the transparent conductive layer and the transparent conductive layer and the semiconductor layer in an actual application state under various climatic and installation conditions.

The invention may be embodied in other specific forms without departing from the spirit and essential characteristics thereof. The present examples are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A solar cell including a substrate and having a first transparent electrode, a non-single crystalline semiconductor layer on said first electrode)and a second electrode on said semiconductor layer, wherein said first transparent electrode is composed of a first zinc oxide layer containing at least one transition metal in which the density of the transition metal is continuously changed in the thickness direction thereof within the range of not less than 1 atomic ppm to 5 atomic %.

2. A solar cell according to claim 1, wherein at least two transition metal elements are contained in the first zinc oxide layer and the total density of said elements is continuously changed in the thickness direction thereof within the range of not less than 1 atomic ppm to not more than 5 atomic %.

3. A solar cell according to claim 1, wherein a second zinc oxide layer in which the density of the transition metal in the thickness direction thereof continuously varies within the range of not less than 1 atomic ppm to 5 atomic % is provided between said non-single crystalline semiconductor layer and said second electrode.

4. A solar cell according to claim 3, wherein said transition metal is less concentrated on the semiconductor layer side of said second zinc oxide layer.

5. A solar cell according to claim 3, wherein the density of said transition metal in said second zinc oxide layer is decreased in the thickness direction thereof toward said semiconductor layer.

6. A solar cell according to claim 1, wherein said non-single crystalline semiconductor layer is of pin-type structure.

7. A solar cell according to claim 1, wherein said second electrode is transparent.

8. A solar cell according to claim 1, wherein said substrate is composed of a conductive metal or alloy.

9. A solar cell according to claim 1, wherein said substrate is transparent.

10. A solar cell according to claim 1, wherein said transition metal is selected from the group consisting of iron, chromium, nickel, cobalt, manganese, titanium, vanadium, molybdenum, tungsten and iridium.

11. A solar cell according to claim 1, wherein said non-single crystalline semiconductor layer is of pinpin-type structure.

12. A solar cell according to claim 1, wherein said transition metal is less concentrated on the semiconductor layer side of said first zinc oxide layer.

13. A solar cell according to claim 1, wherein the ratio of the density of the transition metal further from said semiconductor layer to that nearer said semiconductor layer is 50.

14. A solar cell according to claim 1, wherein the density of the transition metal in said first zinc oxide layer is decreased in the thickness direction thereof toward said non-single crystalline semiconductor layer.

* * * * *

UNITED STATES PATENT AND TRADEMARK OFFICE
CERTIFICATE OF CORRECTION

PATENT NO. : 5,352,300
DATED : October 4, 1994
INVENTOR(S) : MITSUYUKI NIWA

Page 1 of 2

It is certified that error appears in the above-indentified patent and that said Letters Patent is hereby corrected as shown below:

COLUMN 2

Line 25, "a" should read --an--.

COLUMN 5

Line 60, "first second" should read --second--.

COLUMN 7

Line 18, "the output" should read --an output--.

COLUMN 10

Line 38, "a-Si:H-F," should read --a-Si:H:F,--.
Line 66, "sources" should read --source--.

COLUMN 13

Line 11, "the" should read --was--.

COLUMN 16

Line 42, "heater 703" should read --702--.
Line 57, "a" should read --an--.

COLUMN 18

Line 5, "call" should read --cell--.

UNITED STATES PATENT AND TRADEMARK OFFICE
CERTIFICATE OF CORRECTION

PATENT NO. : 5,352,300
DATED : October 4, 1994
INVENTOR(S) : MITSUYUKI NIWA

It is certified that error appears in the above-indentified patent and that said Letters Patent is hereby corrected as shown below:

<u>COLUMN 20</u>

Line 6, "electrode)and" should read --electrode, and--.

Signed and Sealed this

Twenty-first Day of February, 1995

*Attest:*

BRUCE LEHMAN

*Attesting Officer*     *Commissioner of Patents and Trademarks*